(12) United States Patent
Gu et al.

(10) Patent No.: US 9,601,551 B2
(45) Date of Patent: Mar. 21, 2017

(54) ORGANIC LIGHT EMITTING DISPLAY

(71) Applicant: Samsung Display Co., Ltd., Yongin (KR)

(72) Inventors: Bon Seog Gu, Seongnam-si (KR); Jae Hyun Cho, Seoul (KR); Byung Sun Kim, Seoul (KR); Hong Soo Kim, Hwaseong-si (KR); Se Hyuk Park, Seongnam-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/699,476

(22) Filed: Apr. 29, 2015

(65) Prior Publication Data

US 2016/0181337 A1 Jun. 23, 2016

(30) Foreign Application Priority Data

Dec. 19, 2014 (KR) ........................ 10-2014-0183759

(51) Int. Cl.
*H01L 27/32* (2006.01)
*G09G 3/3258* (2016.01)

(52) U.S. Cl.
CPC ....... *H01L 27/3248* (2013.01); *G09G 3/3258* (2013.01); *G09G 2300/0452* (2013.01); *G09G 2300/0842* (2013.01); *G09G 2300/0861* (2013.01); *G09G 2310/0235* (2013.01); *G09G 2320/0242* (2013.01)

(58) Field of Classification Search
CPC .......... G09G 3/30; G09G 3/3291; G09G 5/18; G09G 5/10; G09G 2300/0426; G09G 3/32; G09G 3/3283; G09G 3/3233; G09G 3/3266; G09G 2310/0272; G09G 2320/0252; G09G 2300/0876; H01L 27/3248; H01L 27/3206; H01L 27/273211
USPC .......................................................... 257/40
See application file for complete search history.

(56) References Cited

U.S. PATENT DOCUMENTS

| | | | |
|---|---|---|---|
| 7,535,447 B2 | 5/2009 | Kwak et al. | |
| 7,768,482 B2 | 8/2010 | Kwak | |
| 7,893,915 B2 | 2/2011 | Woo et al. | |
| 2014/0009512 A1* | 1/2014 | Lee | G09G 5/02 345/690 |

(Continued)

FOREIGN PATENT DOCUMENTS

| | | |
|---|---|---|
| KR | 10-2005-0092208 | 9/2005 |
| KR | 10-2006-0065084 | 6/2006 |
| KR | 10-2007-0100992 | 10/2007 |

*Primary Examiner* — Alexander Oscar Williams
(74) *Attorney, Agent, or Firm* — H.C. Park & Associates, PLC

(57) ABSTRACT

An organic light emitting display includes a data driving unit connected to data lines, a scan driving unit connected to scan lines, and a display panel having pixel groups arranged in a region where the data lines and scan lines intersect. A pixel group includes a first pixel unit having a first organic light emitting diode configured to emit light of a first color and a second pixel unit having a second organic light emitting diode configured to emit light of second color. The first pixel unit further includes an organic light emitting diode configured to emit light of a third color and the second pixel unit further includes an organic light emitting diode configured to emit light of the third color.

20 Claims, 4 Drawing Sheets

(56) References Cited

U.S. PATENT DOCUMENTS

| | | | |
|---|---|---|---|
| 2014/0333599 A1* | 11/2014 | Lee | G09G 3/3291 |
| | | | 345/212 |
| 2016/0012779 A1* | 1/2016 | Gu | G09G 3/3233 |
| | | | 345/215 |
| 2016/0019844 A1* | 1/2016 | Yang | G09G 3/3233 |
| | | | 345/205 |
| 2016/0027377 A1* | 1/2016 | Cho | H01L 27/3276 |
| | | | 315/172 |
| 2016/0071464 A1* | 3/2016 | Park | G09G 3/3291 |
| | | | 345/212 |
| 2016/0086546 A1* | 3/2016 | Noh | G09G 3/3258 |
| | | | 345/80 |
| 2016/0093263 A1* | 3/2016 | Kimura | G09G 3/3688 |
| | | | 345/690 |
| 2016/0133172 A1* | 5/2016 | Hwang | G09G 3/006 |
| | | | 324/762.07 |
| 2016/0133195 A1* | 5/2016 | Park | G09G 3/3283 |
| | | | 345/694 |
| 2016/0140899 A1* | 5/2016 | Jeong | G09G 3/3241 |
| | | | 345/212 |
| 2016/0171934 A1* | 6/2016 | Yang | G09G 3/3291 |
| | | | 345/212 |
| 2016/0172425 A1* | 6/2016 | Lee | H01L 27/3253 |
| | | | 257/40 |

* cited by examiner

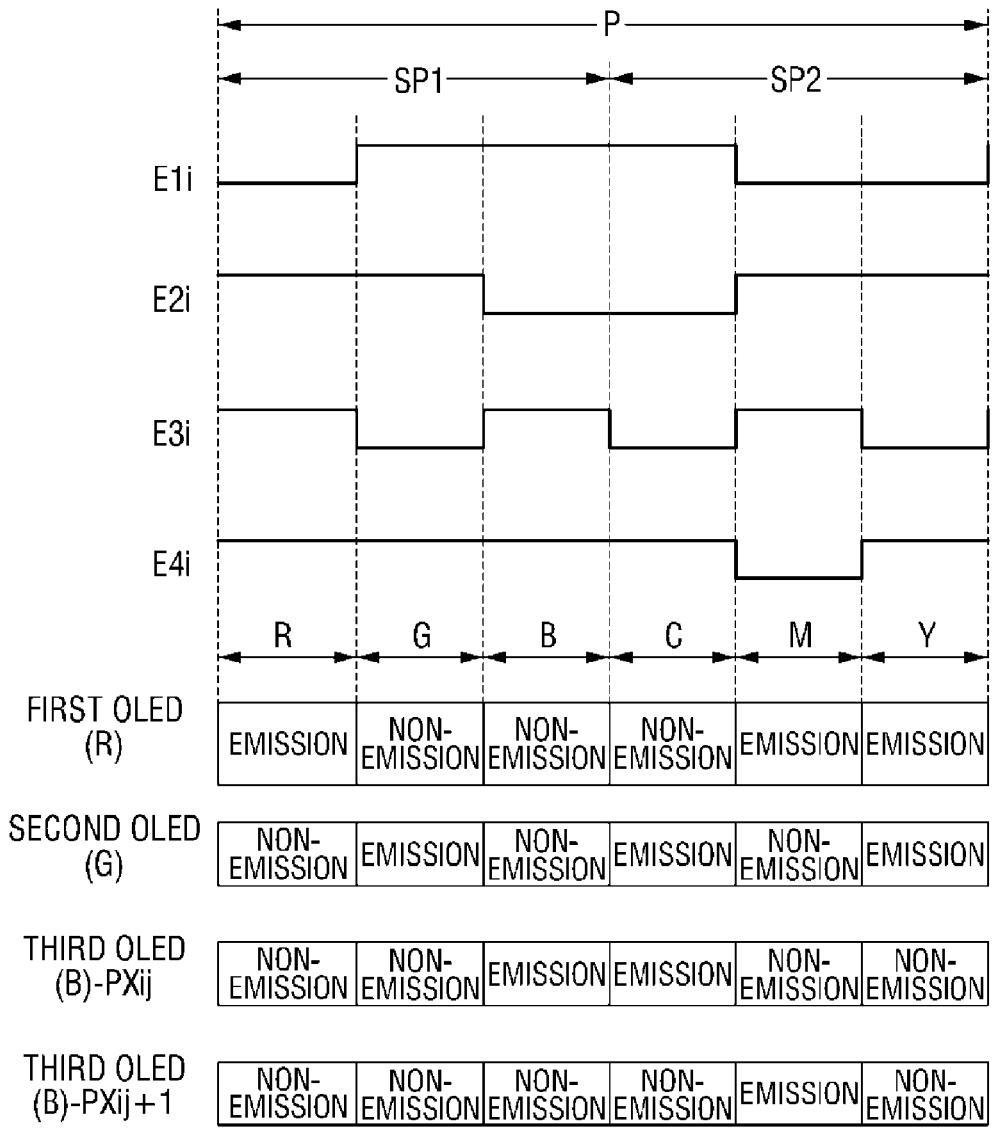

ORGANIC LIGHT EMITTING DISPLAY

CROSS-REFERENCE TO RELATED APPLICATION

This application claims priority from and the benefit of Korean Patent Application No. 10-2014-0183759, filed on Dec. 19, 2014, which is hereby incorporated by reference for all purposes as if fully set forth herein.

BACKGROUND

Field

Exemplary embodiments relate to an organic light emitting display.

Discussion

An organic light emitting display displays an image using organic light emitting diodes (hereinafter referred to as "OLEDs") that emit light through recombination of electrons and holes. The organic light emitting display has the advantages of a rapid response speed, high luminance, large viewing angle, and low power consumption.

The organic light emitting display controls the amount of current that is provided to the OLEDs using driving transistors included in respective pixel units, and the OLEDs generate light having a specific luminance according to the amount of current provided thereto.

In order to express various colors, the organic light emitting display may include a plurality of pixel units that display red, green, and blue, and an image may be expressed through a combination of such colors. In order to implement an organic light emitting display having high resolution, organic light emitting diodes, which are connected to one pixel unit to display red, green, and blue, respectively, may be driven in a temporally separated manner. A color separation phenomenon may occur, however, when driven in a temporally separated manner.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting display.

Additional aspects will be set forth in the detailed description which follows, and, in part, will be apparent from the disclosure, or may be learned by practice of the inventive concept.

According to an exemplary embodiment, an organic light emitting display has a data driving unit connected to data lines, a scan driving unit connected to scan lines, and a display panel having pixel groups arranged in a region where the data lines and scan lines intersect. A pixel group includes a first pixel unit having a first organic light emitting diode configured to emit light of a first color and a second pixel unit having a second organic light emitting diode configured to emit light of second color. The first pixel unit further includes an organic light emitting diode configured to emit light of a third color and the second pixel unit further includes an organic light emitting diode configured to emit light of the third color.

According to an exemplary embodiment, an organic light emitting display has a data driving unit connected to data lines and a display panel having pixel groups that receive data signals through the data lines. A pixel group includes a first pixel unit having first and third organic light emitting diodes configured to emit light of different colors and a second pixel unit having second and third organic light emitting diodes configured to emit light of different colors. The first pixel unit is configured to be driven such that one of the first and third organic light emitting diodes included in the first pixel unit is driven in a complementary color driving period to emit a color. The second pixel unit is configured to be driven such that one of the second and third organic light emitting diodes included in the second pixel unit is driven to emit a color that is different from the color emitted in the organic light emitting diode that is driven in the first pixel unit in the complementary color driving period.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 4 is a timing diagram explaining a method for driving an organic light emitting display according to one or more exemplary embodiments.

DETAILED DESCRIPTION OF THE ILLUSTRATED EMBODIMENTS

Figure 1:
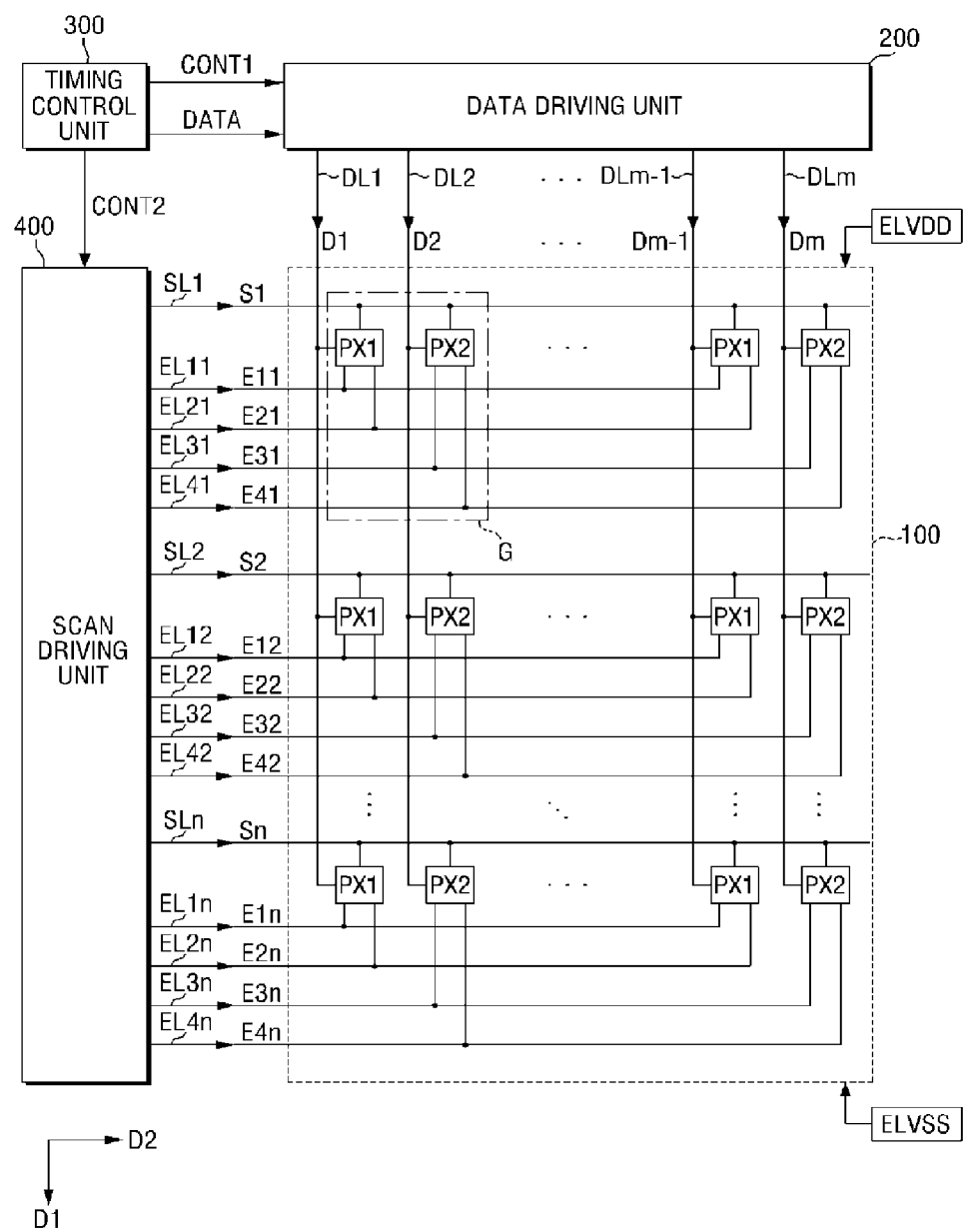
FIG. 1 is a block diagram of an organic light emitting display according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

According to exemplary embodiments, the color separation phenomenon problem may be solved and higher resolution may be achieved through complementary color driving in the organic light emitting display that is driven in a temporarily separated manner.

Referring to FIG. 1, an organic light emitting display according to an embodiment of the present invention may include display panel 100, data driving unit 200, timing control unit 300, scan driving unit 400, and a power supply unit (not illustrated).

Display panel 100 may be a region where an image is displayed. Display panel 100 may be connected to a plurality of data lines DL1 through DLm (where, m is a natural number that is larger than "1") and a plurality of scan lines SL1 through SLn that cross the plurality of data lines DL1 to DLm. Further, display panel 100 may be connected to a plurality of first light emitting control lines EL11 through EL1n, a plurality of second light emitting control lines EL21 through EL2n, a plurality of third light emitting control lines EL31 through EL3n, and a plurality of fourth light emitting control lines EL41 through EL4n. Display panel 100 may include a plurality of pixel groups G arranged in a region where the plurality of data lines DL1 through DLm, the plurality of scan lines SL1 through SLn, and the plurality of first to fourth light emitting control lines EL11 through EL1n through EL41 through EL4n cross each other. In this case, each of the plurality of pixel groups G may include first and second pixel units PX1 and PX2. The plurality of data lines DL1 through DLm, the plurality of scan lines SL1 through SLn, the plurality of first to fourth light emitting control lines EL11 through EL1n through EL41 through EL4n, and the plurality of pixel groups G may be arranged to be insulated from each other on one substrate. The plurality of data lines DL1 through DLm may extend in a first direction d1, and the plurality of scan lines SL1 through SLn may extend in a second direction d2 that crosses the first direction d1. Further, the plurality of first through fourth light emitting control lines EL11 through EL1n through EL41 through EL4n may extend in the second direction d2 in the same manner as the plurality of scan lines SL1 through SLn. Referring to FIG. 1, the first direction d1 may be a column direction, and the second direction d2 may be a row direction.

The plurality of pixel groups G may be arranged in the form of a matrix. Each of the plurality of pixel groups G may be connected to two of the plurality of data lines DL1 through DLm, one of the plurality of scan lines SL1 through SLn, and one of the first to fourth light emitting control lines EL11 through EL1n through EL41 through EL4n. The first pixel unit PX1 may include a first organic light emitting diode that emits light of first color (first OLED(R)) (see FIG. 2) and a third organic light emitting diode that emits light of third color (third OLED(B)) (see FIG. 2). The second pixel unit PX2 may include a second organic light emitting diode that emits light of second color (second OLED(G)) (see FIG. 2) and the third organic light emitting diode that emits light with the third color (third OLED(B)) (see FIG. 2).

In an exemplary embodiment, the first color may be red, the second color may be green, and the third color may be blue. As an example, the first pixel unit PX1 includes the first and third organic light emitting diodes that emit light with the first and third colors, respectively (first OLED(R) and third OLED(B)) (see FIG. 2), and the second pixel unit PX2 includes the second and third organic light emitting diodes that emit light with the second and third colors, respectively (second OLED(G) and third OLED(B)) (see FIG. 2). Other examples comprise arrangements where the first pixel unit PX1 may include the first and second organic light emitting diodes that emit light with the first and second colors, respectively (first OLED(R) and second OLED(G)) (see FIG. 2), and the second pixel unit PX2 may include the first and third organic light emitting diodes that emit light with the first and third colors, respectively (first OLED(R) and third OLED(B)) (see FIG. 2). Each of the plurality of pixel groups G may be connected to a first power terminal ELVDD through a first power line, and may be connected to a second power terminal ELVSS through a second power line. In this case, first and second driving transistors MD1 and MD2 that are respectively included in the first and second pixel units PX1 and PX2 may control the amount of current that flows from the first power terminal ELVDD to the second power terminal ELVSS in correspondence to a data signal that is provided from the data line connected thereto.

Data driving unit 200 may be connected to the display panel 100 through the plurality of data lines DL1 through DLm. Data driving unit 200 may provide data signals D1 through Dm through the plurality of data lines DL1 through DLm under the control of timing control unit 300. Data driving unit 200 may provide the data signal to the pixel unit that is selected according to the scan signal. The first and second pixel units PX1 and PX2 included in the plurality of pixel groups G may emit light according to the data signal provided from Data driving unit 200 in correspondence to the low-level scan signal to display a video image.

Timing control unit 300 may receive a control signal CS and video signals R, G, and B from an external system. The control signal CS may include a vertical sync signal Vsync and a horizontal sync signal Hsync. The video signals R, G, and B include luminance information of the plurality of pixels. The luminance may have 1024, 256, or 64 gray levels. The timing control unit 300 may divide the video signals R, G, and B in the unit of a frame according to the vertical sync signal Vsync, and may divide the video signals R, G, and B in the unit of a scan line according to the horizontal sync signal Hsync to generate video data DATA. Timing control unit 300 may provide control signals CONT1 and CONT2 to data driving unit 200 and scan driving unit 400 according to the control signal CS and the video signals R, G, and B. Timing control unit 300 may provide the video data DATA to data driving unit 200 together with the control signal CONT1, and data driving unit 200 may generate the plurality of data signals D1 through Dm through sampling and holding of the input video data DATA according to the control signal CONT1 and converting of the video data into an analog voltage. Thereafter, data driving unit 200 may provide the plurality of data signals D1 through Dm to the plurality of pixel groups G through the plurality of data lines DL1 through DLm.

The scan driving unit 400 may be connected to the display panel 100 through the plurality of scan lines SL1 through SLn and the plurality of first to fourth light emitting control lines EL11 through EL1*n* through EL41 through EL4*n*. The scan driving unit 400 may sequentially apply a plurality of scan signals S1 through Sn to the plurality of scan lines SL1 through SLn according to the control signal CONT2 provided from timing control unit 300. Further, scan driving unit 400 may apply a plurality of first to fourth light emitting control signals E11 through E1*n* through E41 through E4*n* to the plurality of first to fourth light emitting control lines EL11 through EL1*n* through EL41 through EL4*n*. Scan driving unit 400 may provide the plurality of first to fourth light emitting control signals E11 through E1*n* through E41 through E4*n* to the plurality of pixel groups G. As another example, the plurality of first to fourth light emitting control signals E11 through E1*n* through E41 through E4*n* may be provided through a separate integrated circuit IC and control lines connected thereto. In the case where a separate integrated circuit IC is included, the scan driving unit 400 may include a scan signal providing unit (not illustrated) connected to the plurality of scan lines SL1 through SLn, a control signal providing unit (not illustrated) connected to the plurality of first to fourth light emitting control lines EL11 through EL1*n* through EL41 through EL4*n*, and a switching element connecting or intercepting signal paths between the scan signal providing unit and the control signal providing unit. Scan driving unit 400 may control the switching operation of the switching element according to the control signal CONT2 provided from the timing control unit 300 to select one of the scan signal providing unit (not illustrated) and the control signal providing unit (not illustrated).

The power supply unit (not illustrated) may provide driving voltages to the plurality of pixel groups G according to the control signal provided from timing control unit 300. The first and second power terminals ELVDD and ELVSS may provide the driving voltages required for the operation of the plurality of pixel groups G. As an example, the voltage that is provided from the first power terminal ELVDD may be relatively high, and the voltage that is provided from the second power terminal ELVSS may be relatively low.

Figure 2:
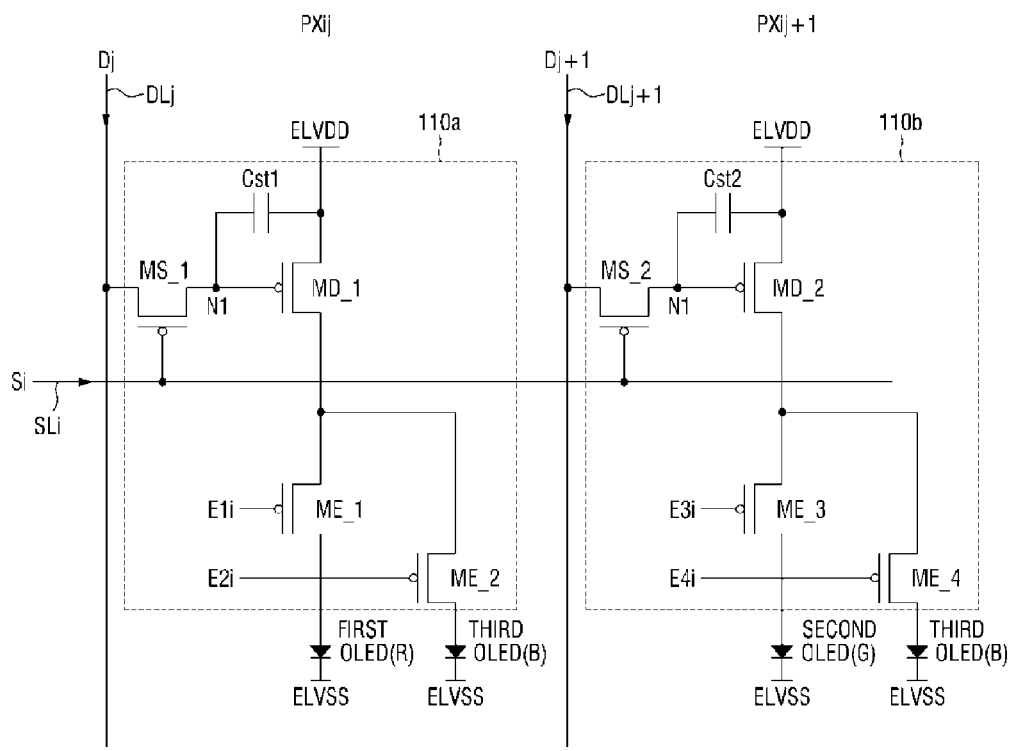
FIG. 2 is a circuit diagram of an example of a pixel group included in a display panel in the configuration of the organic light emitting display illustrated in FIG. 1.

FIG. 2 is a circuit diagram of an exemplary embodiment of pixel group G, which is included in display panel 100 in the configuration of the organic light emitting display illustrated in FIG. 1. The pixel group G illustrated in FIG. 2 may include first and second pixel units PX$_{ij}$ and PX$_{ij+1}$. In this case, the first pixel unit PX$_{ij}$ may be connected to the i-th scan line SL$_i$, the j-th data line DL$_j$, and the first and second light emitting control lines EL1*i* and EL2*i*, and the second pixel unit PX$_{ij+1}$ may be connected to the i-th scan line SL$_i$, the (j+1)-th data line DL$_{j+1}$, and the third and fourth light emitting control lines EL3*i* and EL4*i*. Alternatively, other pixel groups G may have the same structure, and circuits of the first and second pixel units PX$_{ij}$ and PX$_{ij+1}$ in the pixel group G are not limited thereto.

Referring to FIG. 2, the first pixel unit PX$_{ij}$ according to an exemplary embodiment of the present invention may include a first switching transistor MS_1, a first driving transistor MD_1, first and second light emitting control transistors ME_1 and ME_2, a first storage capacitor Cst1, and first and third organic light emitting diodes (first OLED (R) and third OLED(B)).

The first switching transistor MS_1 may include an electrode connected to the j-th data line DL$_j$, another electrode connected to a first node N1, and a gate electrode connected to the i-th scan line SL$_i$. The first switching transistor MS_1 may be turned on by the i-th (e.g., low-level) scan signal S$_i$ that is applied to the i-th scan line SL$_i$ to provide the j-th data signal D$_j$ that is provided through the j-th data line DL$_j$ to the first node N1. The first switching transistor MS_1 may be a p-channel field effect transistor. That is, the first switching transistor MS_1 may be turned on by a low-level scan signal, and may be turned off by a high-level scan signal.

First driving transistor MD_1 may include an electrode connected to the first power terminal ELVDD, another electrode connected to an electrode of first light emitting control transistor ME_1 and an electrode of the second light emitting control transistor ME_2, and a gate electrode connected to first node N1. In accordance with the value that is charged in first storage capacitor Cst1, first driving transistor MD_1 may control the amount of driving current that is provided from the first power terminal ELVDD to the second power terminal ELVSS through the first or third organic light emitting element (first OLED(R) or third OLED(B)).

First light emitting control transistor ME_1 may include an electrode connected to an electrode of the first driving transistor MD_1, another electrode connected to the first organic light emitting diode (first OLED(R)), and a gate electrode connected to the first light emitting control line EL1*i*. The first light emitting control transistor ME_1 may prevent driving current from flowing to the first organic light emitting diode (first OLED(R)) according to the first light emitting control signal E1i that is provided through the first light emitting control line EL1i.

Second light emitting control transistor ME_2 may include an electrode connected to an electrode of the first driving transistor MD_1, another electrode connected to the third organic light emitting diode (third OLED(B)), and a gate electrode connected to the second light emitting control line E2i. The second light emitting control transistor ME_2 may prevent driving current from flowing to the third organic light emitting diode (third OLED(B)) according to the second light emitting control signal E2i that is provided through the second light emitting control line EL2i.

First storage capacitor Cst1 may include a terminal connected to the first node N1 and another terminal connected to the first power terminal ELVDD. The first storage capacitor Cst1 may be charged with a value that corresponds to the j-th data signal Dj provided through the switching operation of the first switching transistor MS_1.

The first organic light emitting diode (first OLED(R)) may include an anode electrode connected to an electrode of the first light emitting control transistor ME_1, a cathode electrode connected to the second power terminal ELVSS, and an organic light emitting layer. The organic light emitting layer included in the first organic light emitting diode (first OLED(R)) may emit light of first color that is one of the primary colors. In this case, the primary colors may be red, green, and blue, and the first color may be, for example, red. Further, a second color may be green, and a third color may be blue. A desired color may be displayed through a spatial sum or temporal sum of the three primary colors. The organic light emitting layer that is included in the first organic light emitting diode (first OLED(R)) may include low-molecular organic materials or high-molecular organic materials that correspond to the first color.

The third organic light emitting diode (third OLED(B)) may include an anode electrode connected to an electrode of the second light emitting control transistor ME_2, a cathode electrode connected to the second power terminal ELVSS, and an organic light emitting layer. The organic light emitting layer included in the third organic light emitting diode (third OLED(B)) may emit light of third color that is one of the primary colors, i.e., blue. The organic light emitting layer that is included in the third organic light emitting diode (third OLED(B)) may include low-molecular organic materials or high-molecular organic materials that correspond to the third color.

The second pixel unit PXij+1 may include a second switching transistor MS_2, a second driving transistor MD_2, third and fourth light emitting control transistors ME_3 and ME_4, a second storage capacitor Cst2, and second and third organic light emitting diodes (second OLED(G) and third OLED(B)).

The second switching transistor MS_2 may include an electrode connected to the (j+1)-th data line DLj+1, another electrode connected to the second node N2 in the second pixel unit PXij+1, and a gate electrode connected to the i-th scan line SLi. The second switching transistor MS_2 may be turned on by the i-th scan signal Si (e.g., of a low level) that is applied to the i-th scan line SLi to provide the (j+1)-th data signal Dj+1 that is provided through the (j+1)-th data line DLj+1 to the second node N2. Second switching transistor MS_2 may be a p-channel field effect transistor. That is, the second switching transistor MS_2 may be turned on by a low-level scan signal, and may be turned off by a high-level scan signal.

The second driving transistor MD_2 may include an electrode connected to the first power terminal ELVDD, another electrode connected to an electrode of the third light emitting control transistor ME_3 and an electrode of the fourth light emitting control transistor ME_4, and a gate electrode connected to the second node N2. In accordance with the value that is charged in the second storage capacitor Cst2, the second driving transistor MD_2 may control the amount of driving current that is provided from the first power terminal ELVDD to the second power terminal ELVSS through the second or third organic light emitting element (second OLED(G) or third OLED(B)).

Third light emitting control transistor ME_3 may include an electrode connected to an electrode of the second driving transistor MD_2, another electrode connected to the second organic light emitting diode (second OLED(G)), and a gate electrode connected to the third light emitting control line E3i. The third light emitting control transistor ME_3 may prevent driving current from flowing to the second organic light emitting diode (second OLED(G)) according to the third light emitting control signal E3i that is provided through the third light emitting control line EL3i.

The fourth light emitting control transistor ME_4 may include an electrode connected to an electrode of the second driving transistor MD_2, another electrode connected to the third organic light emitting diode (third OLED(B)), and a gate electrode connected to the fourth light emitting control line E4i. The fourth light emitting control transistor ME_4 may prevent driving current from flowing to the third organic light emitting diode (third OLED(B)) according to the fourth light emitting control signal E4i that is provided through the fourth light emitting control line EL4i.

The second storage capacitor Cst2 may include a terminal connected to the second node N2 and another terminal connected to the first power terminal ELVDD. The second storage capacitor Cst2 may be charged with a value that corresponds to the j-th data signal Dj (e.g., a delta voltage) provided through the switching operation of the second switching transistor MS_2.

The second organic light emitting diode (second OLED(G)) may include an anode electrode connected to an electrode of the third light emitting control transistor ME_3, a cathode electrode connected to the second power terminal ELVSS, and an organic light emitting layer. The organic light emitting layer included in the second organic light emitting diode (second OLED(G)) may emit light of second color that is one of the primary colors, e.g., green. The organic light emitting layer that is included in the second organic light emitting diode (second OLED(G)) may include low-molecular organic materials or high-molecular organic materials that correspond to the second color.

The third organic light emitting diode (third OLED(B)) that is included in the second pixel unit PXij+1 may include an anode electrode connected to an electrode of the fourth light emitting control transistor ME_4, a cathode electrode connected to the second power terminal ELVSS, and an organic light emitting layer. The organic light emitting layer of the third organic light emitting diode (third OLED(B)) included in the second pixel unit PSij+1 may emit light of third color that is one of the primary colors, e.g., blue. The organic light emitting layer that is included in the third organic light emitting diode (third OLED(B)) may include low-molecular organic materials or high-molecular organic materials that correspond to the third color.

The first and second switching transistors MS_1 and MS_2, the first and second driving transistors MD_1 and MD_2, the first to fourth light emitting control transistors ME_1, ME_2, ME_3, and ME_4 may all be p-channel field effect transistors, or some of all of the respective transistors may be n-channel field effect transistors. Further, while it has been described that the first and second light emitting control signals E1$i$ and E2$i$ are provided to the first and second light emitting control transistors ME_1 and ME_2, in the case where the first and second light emitting control transistors ME_1 and ME_2 are configured to be of different channel types and complementarily perform switching operations, both the first and second light emitting control transistors ME_1 and ME_2 can be controlled by one control signal. In the same manner, in the case where the third and fourth light emitting control transistors ME_3 and ME_4 are configured to be of different channel types and complementarily perform switching operations, both the third and fourth light emitting control transistors ME_3 and ME_4 can be controlled by one control signal.

Figure 3:
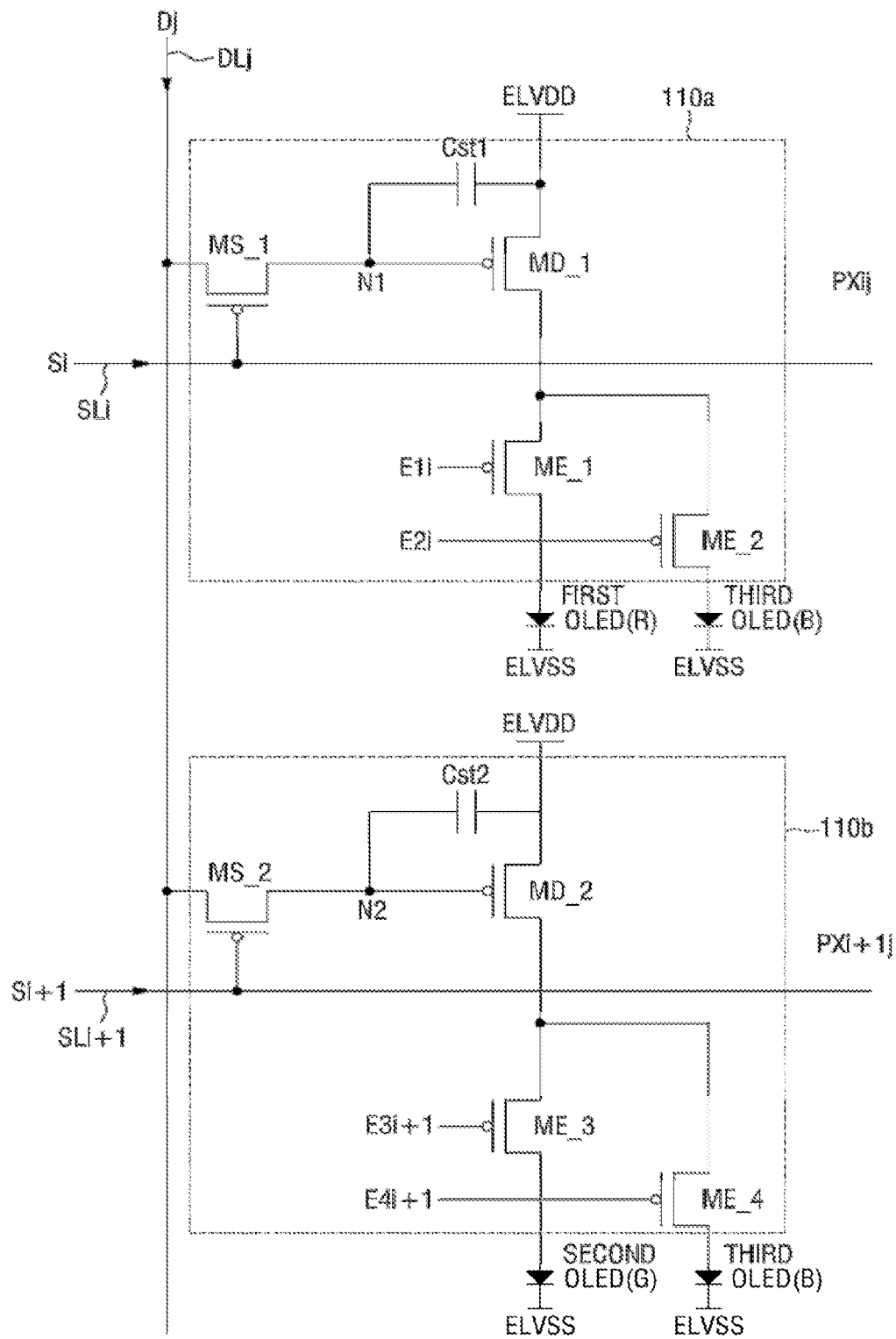
FIG. 3 is a circuit diagram of another example of a pixel group in the configuration of an organic light emitting display according to one or more exemplary embodiments.

FIG. 3 is a circuit diagram of another example of a pixel group G in the configuration of an organic light emitting display according to an embodiment of the present invention. However, duplicate explanation of the same portions as those of the pixel group G of FIG. 2 will be omitted.

Referring to FIG. 3, another example of a pixel group G in the configuration of an organic light emitting display may include first and second pixel units PXij and PXi+1j. As another example of the pixel group G, the first pixel unit PXij may be connected to the i-th scan line SLi, the j-th data line DLj, and the first and second light emitting control lines EL1$i$ and EL2$i$, and the second pixel unit PXi+1j may be connected to the (i+1)-th scan line SLi+1, the j-th data line DLj, and the third and fourth light emitting control lines EL3$i$+1 and EL4$i$+1.

The second switching transistor MS_2 in the configuration of the second pixel unit PXij+1 may include an electrode connected to the j-th data line DLj and a gate electrode connected to the (i+1)-th scan line SLi+1. The second switching transistor MS_2 may be turned on by the (i+1)-th scan signal Si+1 (e.g., of a low level) that is applied to the (i+1)-th scan line SLi+1 to provide the j-th data signal Dj that is provided through the j-th data line DLj to the second node N2. Further, the third light emitting control transistor ME_3 may include a gate electrode connected to the third light emitting control line E3$i$+1. The third light emitting control transistor ME_3 may prevent driving current from flowing to the second organic light emitting diode (second OLED(G)) according to the third light emitting control signal E3$i$+1 that is provided through the third light emitting control line EL3$i$+1. The fourth light emitting control transistor ME_4 may include a gate electrode connected to the fourth light emitting control line E4$i$+1. The fourth light emitting control transistor ME_4 may prevent driving current from flowing to the third organic light emitting diode (third OLED(B)) according to the fourth light emitting control signal E4$i$+1 that is provided through the fourth light emitting control line EL4$i$+1.

The organic light emitting display according to an embodiment of the present invention may further include a multiplexer (not illustrated) arranged between the display panel 100 (see FIG. 1) and the data driving unit 200 (see FIG. 1). The multiplexer may be connected to the plurality of data lines DL1 to DLm and a plurality of digital-to-analog converters (DAC) (not illustrated) in the data driving unit 200 to connect or intercept signal paths between the plurality of data lines DL1 to DLm and the plurality of digital-to-analog converters through switching operations. Accordingly, the arrangement of the first and second pixel units PXij and PXij+1 in the display panel 100 may be controlled by the multiplexer that performs switching of the plurality of signal paths, and thus is not limited to that as illustrated in FIGS. 3 and 4 so far as complementary light emission is sufficiently possible through complementary color driving to be described later.

FIG. 4 is a timing diagram explaining a method for driving an organic light emitting display according to an embodiment of the present invention. Referring to FIG. 4, the driving period P of the organic light emitting display according to one or more exemplary embodiments may be divided into a primary color driving period SP1 and a complementary color driving period SP2. Further, each of the primary color driving period SP1 and the complementary color driving period SP2 may include first to third sub-frame periods. FIG. 4 illustrates that the complementary color driving period SP2 follows after the primary color driving period SP1, but the primary color driving period SP1 may follow the complementary color driving period SP2.

In the primary color driving period SP1, the pixel group G in the configuration of the organic light emitting display may emit light with primary colors. More specifically, the primary color driving period SP1 may include a first sub-frame period in which light is emitted with a first color, a second sub-frame period in which light is emitted with a second color, and a third sub-frame period in which light is emitted with a third color. In this case, it is not necessary for the first to third sub-frame periods to proceed in the order of the first to third sub-frame periods, but the first to third sub-frame periods are merely simple examples of the driving periods by colors. Hereinafter, it is assumed that in the primary color driving period SP1, the first sub-frame period is a period in which light is emitted with the first color, e.g., red, the second sub-frame period is a period in which light is emitted with the second color, e.g., green, and the third sub-frame period is a period in which light is emitted with the third color, e.g., blue.

Since the first sub-frame period in the primary color driving period SP1 is a period in which red light is emitted, the first light emitting control transistor ME_1 may be switched to a turn-on state through reception of the first light emitting control signal E1$i$ (e.g., of a low level). In contrast, the second to fourth light emitting control transistors ME_2, ME_3, and ME_4 may be switched to a turn-off state through reception of the second to fourth light emitting control signals E2$i$, E3$i$, and E4$i$.

The first driving transistor MD_1 of the first pixel unit PXij may control the driving current that flows to the first organic light emitting diode (first OLED(R)) according to the voltage charged in the first storage capacitor Cst1 in the previous frame.

The first organic light emitting diode (first OLED(R)) may emit light with the first color according to the provided driving current.

Since the second sub-frame period in the primary color driving period SP1 is a period in which green light is emitted, the third light emitting control transistor ME_3 may be switched to a turn-on state through reception of the third light emitting control signal E3$i$ (e.g., of a low level). In contrast, the first, second, and fourth light emitting control transistors ME_1, ME_2, and ME_4 may be switched to a turn-off state through reception of the first, second and fourth light emitting control signals E1$i$, E2$i$, and E4$i$.

Referring to FIGS. 2 and 4, the second driving transistor MD_2 of the second pixel unit PXij+1 may control the driving current that flows to the second organic light emitting diode (second OLED(G)) according to the voltage charged in the second storage capacitor Cst2 in the previous frame.

The second organic light emitting diode (second OLED (G)) may emit light with the second color according to the provided driving current.

In the same manner, since the third sub-frame period in the primary color driving period SP1 is a period in which blue light is emitted, the second organic light emitting control transistor ME_2 is turned on, and the third organic light emitting diode (third OLED(B)) included in the first pixel unit PXij may emit light with the third color. Alternatively, ME_2 may be turned off and in the third sub-frame period, the fourth organic light emitting control transistor ME_4 may be turned on, and thus the third organic light emitting diode (third OLED(B)) included in the second pixel unit PXij+1 may emit light with the third color. As another alternative, the second and fourth organic light emitting control transistors ME_2 and ME_4 may be turned on, and thus the third organic light emitting diode (third OLED(B)) included in the first and second pixel units PXij and PXij+1 may emit light with the third color.

In the complementary color driving period SP2, the pixel group G in the configuration of the organic light emitting display according to the present invention may emit light of complementary color. More specifically, the complementary color driving period SP2 may include a first sub-frame period in which light is emitted with a fourth color, a second sub-frame period in which light is emitted with a fifth color, and a third sub-frame period in which light is emitted with a sixth color. In this case, the fourth color may be formed by a combination of the second color and the third color, and as a more particular example, the fourth color may be cyan that is formed by a combination of green (a second color) and blue (a third color).

The fifth color may be formed by a combination of the first color and the third color, and as a more particular example, the fifth color may be magenta that is formed by a combination of red (a first color) and blue (a third color).

The sixth color may be formed by a combination of the first color and the second color, and more particularly, the sixth color may be yellow that is formed by a combination of red that is the first color and green that is the second color.

It is not necessary for the first to third sub-frame periods to proceed in the order of the first to third sub-frame periods, but the first to third sub-frame periods are merely simple examples of the driving periods by colors. Hereinafter, it is assumed that in the complementary color driving period SP2, the first sub-frame period is a period in which light is emitted with the fourth color, e.g., cyan, the second sub-frame period is a period in which light is emitted with the fifth color, e.g., magenta, and the third sub-frame period is a period in which light is emitted with the sixth color, e.g., yellow.

In the example, the first sub-frame period in the complementary color driving period SP2 is a period in which cyan light is emitted, the second light emitting control transistor ME_2 and the third light emitting control transistor ME_3 may be switched to a turn-on state through reception of the second and third light emitting control signals E2$i$ and E3$i$. In contrast, the first and fourth light emitting control transistors ME_1 and ME_4 may be switched to a turn-off state through reception of the first and fourth light emitting control signals E1$i$ and E4$i$.

The first driving transistor MD_1 of the first pixel unit PXij may control the driving current that flows to the third organic light emitting diode (third OLED(B)) according to the value charged in the first storage capacitor Cst1 in the previous frame.

The third organic light emitting diode (third OLED(B)) may emit light with the third color according to the provided driving current.

The second driving transistor MD_2 of the second pixel unit PXij+1 may control the driving current that flows to the second organic light emitting diode (second OLED(G)) according to the value charged in the second storage capacitor Cst2 in the previous frame.

The second organic light emitting diode (second OLED (G)) may emit light with the second color according to the provided driving current. Accordingly, the third organic light emitting diode (third OLED(B)) of the first pixel unit PXij may emit the blue light, and the second organic light emitting diode (second OLED(G)) of the second pixel unit PXij+1 may emit the green light, so that the pixel group G may emit the cyan light.

Since the second sub-frame period in the complementary color driving period SP2 is a period in which magenta light is emitted, the first light emitting control transistor ME_1 and the fourth light emitting control transistor ME_4 may be switched to a turn-on state through reception of the first and fourth light emitting control signals E1$i$ and E4$i$. In contrast, the second and third light emitting control transistors ME_2 and ME_3 may be switched to a turn-off state through reception of the second and third light emitting control signals E2$i$ and E3$i$.

The first driving transistor MD_1 of the first pixel unit PXij may control the driving current that flows to the first organic light emitting diode (first OLED(R)) according to the value charged in the first storage capacitor Cst1 in the previous frame.

The first organic light emitting diode (first OLED(R)) may emit light with the first color according to the provided driving current.

The second driving transistor MD_2 of the second pixel unit PXij+1 may control the driving current that flows to the third organic light emitting diode (third OLED(B)) according to the value charged in the second storage capacitor Cst2 in the previous frame.

The third organic light emitting diode (third OLED(B)) may emit light with the third color according to the provided driving current.

Accordingly, the first organic light emitting diode (first OLED(R)) of the first pixel unit PXij may emit the red light, and the third organic light emitting diode (third OLED(B)) of the second pixel unit PXij+1 may emit the blue light, so that the pixel group G may emit the magenta light.

In the same manner, since the third sub-frame period in the complementary color driving period SP2 is a period in which yellow light is emitted, the first light emitting control transistor ME_1 and the second organic light emitting control transistor ME_2 may be switched to a turn-on state through reception of the first and second light emitting control signals E1$i$ and E2$i$. The third and fourth light emitting control transistors ME_3 and ME_4 may be switched to a turn-off state through reception of the third and fourth emitting control signals E3$i$ and E4$i$ of a high level. Accordingly, the first organic light emitting diode (first OLED(R)) of the first pixel unit PXij may emit the red light, and the second organic light emitting diode (second OLED (G)) of the second pixel unit PXij+1 may emit the green light, so that the pixel group G may emit the yellow light. That is, in the complementary color driving period SP2, the pixel group G may generate a complementary color through a combination of the light emitting colors of the organic light emitting diodes that are selected from the first and second pixel units PXij and PXij+1 in the respective sub-frame periods.

Alternatively, since the third organic light emitting diode (third OLED(B)) is commonly included in the respective pixel units PXij and PXij+1, the cyan or magenta, which requires the blue, may be obtained through selection of one of the first and second pixel units PXij and PXij+1. Accordingly, the organic light emitting diodes that are included in one of the first and second pixel units PXij and PXij+1 may emit light.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting display comprising:
a data driving unit connected to data lines;
a scan driving unit connected to scan lines; and
a display panel comprising pixel groups arranged in a region where the data lines and scan lines intersect, wherein:
a pixel group comprises a first pixel unit comprising a first organic light emitting diode configured to emit light of a first color and a second pixel unit comprising a second organic light emitting diode configured to emit light of second color; and
wherein the first pixel unit further comprises a third organic light emitting diode configured to emit light of a third color, the second pixel unit further comprises a fourth organic light emitting diode configured to emit light of the third color, and the first and second pixel units are connected to a first scan line.

2. The organic light emitting display of claim 1, wherein:
the first pixel unit further comprises:
a first switching transistor connected to a data line and the first scan line, a first driving transistor comprising a gate electrode connected to an electrode of the first switching transistor and an output electrode, a first light emitting control transistor comprising an electrode connected to the output electrode of the first driving transistor and another electrode connected to the first organic light emitting diode, and a second light emitting control transistor comprising an electrode connected to the output electrode of the first driving transistor and another electrode connected to the third organic light emitting diode in the first pixel unit; and
the second pixel unit further comprises:
a second switching transistor connected to a data line and the first scan line, a second driving transistor comprising a gate electrode connected to an electrode of the second switching transistor and an output electrode, a third light emitting control transistor comprising an electrode connected to the output electrode of the second driving transistor and another electrode connected to the second organic light emitting diode, and a fourth light emitting control transistor comprising an electrode connected to the output electrode of the second driving transistor and another electrode connected to the fourth organic light emitting diode in the second pixel unit.

3. The organic light emitting display of claim 2, wherein the scan driving unit is configured to turn on the second and third light emitting control transistors in a sub-frame period of a complementary color driving period, turn on the first and fourth light emitting control transistors in a sub-frame period of the complementary color driving period, and turn on the first and third light emitting control transistors in a sub-frame period of the complementary color driving period.

4. The organic light emitting display of claim 3, wherein:
the sub-frame period when the second and third light emitting control transistors are turned on displays the complementary color cyan,
the sub-frame period when the first and fourth light emitting control transistors are turned on displays the complementary color magenta; and
the sub-frame period when the first and third light emitting control transistors are turned on displays the complementary color yellow.

5. The organic light emitting display of claim 2, wherein:
the first through fourth light emitting control transistors are field effect transistors comprising P-MOS channels.

6. The organic light emitting display of claim 2, wherein:
the first and second light emitting control transistors have different channel types; and
the third and fourth light emitting control transistors have different channel types.

7. The organic light emitting display of claim 2, wherein the scan driving unit is configured to provide first through fourth light emitting control signals to respective gate electrodes of the first through fourth light emitting control transistors through first through fourth light emitting control lines.

8. The organic light emitting display of claim 1, wherein:
the first color is in a red wavelength range, the second color is in a green wavelength range, and the third color is in a blue wavelength range.

9. The organic light emitting display of claim 1, further comprising:
a multiplexer connected between the data driving unit and the display panel.

10. An organic light emitting display comprising:
a data driving unit connected to data lines;
a scan driving unit connected to scan lines; and
a display panel comprising pixel groups that receive data signals through the data lines, wherein:
a pixel group comprises a first pixel unit comprising first and third organic light emitting diodes configured to emit light of different colors and a second pixel unit comprising second and fourth organic light emitting diodes configured to emit light of different colors wherein the first and second pixel units are connected to a first scan line;
the first pixel unit is configured to be driven such that one of the first and third organic light emitting diodes in the first pixel unit is driven in a complementary color driving period to emit a color; and
the second pixel unit is configured to be driven such that one of the second and fourth organic light emitting diodes in the second pixel unit is driven to emit a color that is different from the color emitted in the organic light emitting diode that is driven in the first pixel unit in the complementary color driving period.

11. The organic light emitting display of claim 10, wherein:
the first pixel unit further comprises a first driving transistor configured to control an amount of current that is selectively provided to the first or third organic light emitting diodes in the first pixel unit, a first light emitting control transistor configured to connect or break a path between the first driving transistor and the first organic light emitting diode, and a second light emitting control transistor configured to connect or break a path between the first driving transistor and the third organic light emitting diode; and the second pixel unit further comprises a second driving transistor configured to control an amount of current that is selectively provided to the second or fourth organic light emitting diodes in the second pixel unit, a third light emitting control transistor configured to connect or break a path between the second driving transistor and the second organic light emitting diode, and a fourth light emitting control transistor configured to connect or break a path between the second driving transistor and the fourth organic light emitting diode.

12. The organic light emitting display of claim 11, wherein:
the complementary color driving period comprises a sub-frame period in which the complementary color cyan is displayed, a sub-frame period in which the complementary color magenta is displayed, and a sub-frame period in which the complementary color yellow is displayed.

13. The organic light emitting display of claim 11, further comprising a scan driving unit configured to turn on the second and third light emitting control transistors in a sub-frame period of a complementary color driving period, turn on the first and fourth light emitting control transistors in a sub-frame period of the complementary color driving period, and turn on the first and third light emitting control transistors in a sub-frame period of the complementary color driving period.

14. The organic light emitting display of claim 11, wherein:
the first to fourth light emitting control transistors are field effect transistors comprising P-MOS channels.

15. The organic light emitting display of claim 11, wherein:

the first and second light emitting control transistors are configured to perform switching operations complementarily; and the third and fourth light emitting control transistors are configured to perform switching operations complementarily.

16. The organic light emitting display of claim 11, further comprising a scan driving unit configured to turn on only one of the light emitting control transistors in the pixel groups during at least a portion of a primary color driving period.

17. The organic light emitting display of claim 16, wherein:
the primary color driving period comprises a sub-frame period in which the primary color red is displayed, a sub-frame period in which the primary color green is displayed, and a sub-frame period in which the primary color blue is displayed.

18. The organic light emitting display of claim 11, further comprising a scan driving unit providing light emitting control signals to gate electrodes of the light emitting control transistors through light emitting control lines.

19. The organic light emitting display of claim 10, wherein:
the first organic light emitting diode emits light of a first color, the second organic light emitting diode emits light of a second color, and the third and fourth organic light emitting diodes emit light of a third color; and
the first color is in a red wavelength range, the second color is in a green wavelength range, and the third color is in a blue wavelength range.

20. The organic light emitting display of claim 10, further comprising:
a multiplexer that connects or breaks signal paths between the pixel groups and the data driving unit.

* * * * *